United States Patent [19]
Gentilman et al.

[11] Patent Number: 5,950,291
[45] Date of Patent: Sep. 14, 1999

[54] METHOD OF MANUFACTURING A CONFORMABLE COMPOSITE ACOUSTIC TRANSDUCER PANEL

[75] Inventors: Richard L. Gentilman, Acton; Leslie J. Bowen, Concord, both of Mass.

[73] Assignee: Materials Systems Inc., Littleton, Mass.

[21] Appl. No.: 08/899,577

[22] Filed: Jul. 24, 1997

Related U.S. Application Data

[62] Division of application No. 08/510,393, Aug. 2, 1995, Pat. No. 5,691,960.

[51] Int. Cl.$^6$ .................................................. H04R 17/00
[52] U.S. Cl. .......................... 29/25.35; 29/594; 367/155
[58] Field of Search ..................... 29/25.35, 594; 367/140, 152, 153, 155, 158, 162, 165, 173, 176; 310/357, 358, 359, 337, 334, 800

[56] References Cited

U.S. PATENT DOCUMENTS

| | | | |
|---|---|---|---|
| 5,142,187 | 8/1992 | Saito et al. | 310/334 |
| 5,239,736 | 8/1993 | Siiwa, Jr. et al. | 29/25.35 |
| 5,340,510 | 8/1994 | Bowen | 264/22 |

*Primary Examiner*—Carl E. Hall
*Assistant Examiner*—Daniel Caputo
*Attorney, Agent, or Firm*—Frances P. Craig

[57] ABSTRACT

Methods for fabricating a conformable composite acoustic transducer panel including a conformable composite body having upper and lower planar faces and upper and lower thin, flexible electrodes bonded to the upper and lower faces, respectively. The composite body includes an array of individual piezoelectric or electrostrictive ceramic elements extending normal to the upper and lower faces and through the composite body from the upper face to the lower face to electrically contact the electrodes. Stiff integral face plates are bonded to the side surfaces of the elements at their upper and lower ends. Alternatively, a conformable, stiff, voided polymer matrix is bonded to the element sides over their entire length. Flexible circuit boards may be bonded to the electrodes to provide electrical contact thereto.

5 Claims, 5 Drawing Sheets

METHOD OF MANUFACTURING A CONFORMABLE COMPOSITE ACOUSTIC TRANSDUCER PANEL

This is a divisional U.S. application Ser. No. 08/510,393 filed on Aug. 2, 1995, now U.S. Pat. No. 5,691,960.

BACKGROUND OF THE INVENTION

The present invention relates to electrically activated acoustic transducers and hydrostatic pressure sensors, and particularly relates to acoustic transducer panels fabricated as a composite of a piezoelectric or electrostrictive ceramic material and a polymeric material as well as methods for fabrication thereof.

The need for detection and control of vibration and noise has long been recognized in technical applications such as hydrophones, actuators, hydrodynamic flow control, hydrodynamic noise control, underwater sound suppression, and structural vibration control. Electromechanical transducers, especially piezoelectric ceramics and polymers, have been used for the interconversion of electrical and mechanical energy in such acoustic applications. Piezoelectric and electrostrictive ceramic/polymer composite materials have been identified as having significant potential for improving the performance of many acoustic transducer systems.

Two of the most important configurations developed for such a composite transducer are those exhibiting the so-called 1-3 and 2-2 connectivity described in detail in U.S. Pat. No. 5,340,510, issued to Leslie J. Bowen, one of the inventors of the present application. (U.S. Pat. No. 5,340,510 is incorporated herein by reference.) The 1-3 composite is a one-dimensionally connected piezoelectric or electrostrictive ceramic phase, e.g., an array of lead zirconate titanate (PZT) rods, pins, or fibers, contained within a three-dimensionally connected polymer phase. The 2-2 composite is made up of two-dimensionally connected ceramic, e.g., parallel PZT strips, separated by two-dimensionally connected parallel polymer strips.

Presently, a thin stiff face plate, e.g., one fabricated from glass-fiber reinforced plastic (GRP) or metal, is bonded to the transducer panel as an end cap or cover plate for the ends of the rods to minimize in-plane motion of the transducer. In some situations, however, the introduction of such a stiffening face plate can lead to other concerns. For example, delamination of the device may occur during use, the device may be susceptible to damage from shock, or the device may not be sufficiently flexible or conformable to, e.g., non-planar mounting surfaces.

Especially desired for the hydrodynamic flow control, hydrodynamic noise control, underwater sound suppression, and structural vibration control applications described above, as well as other applications, has been a flexible, shape-conforming actuator panel configuration which can be applied over and conformed to a large surface area to detect and control vibration and noise over that area. Ideally, such an actuator panel should exhibit a very high actuator authority, provide a uniform surface response, be rugged and shock resistant, and be readily fabricated at relatively low cost. The composite acoustic transducer panels described herein were developed to address that need.

SUMMARY OF THE INVENTION

In some embodiments, the invention is a conformable composite acoustic transducer panel including a conformable composite body having upper and lower planar faces and upper and lower thin, flexible electrodes bonded to the upper and lower faces, respectively. The composite body includes an array of individual piezoelectric or electrostrictive ceramic elements, each of the elements having opposing ends, and one or more sides interconnecting the opposing ends. The elements are disposed normal to the upper and lower faces and extend through the composite body from the upper face to the lower face to electrically contact each of the electrodes. The composite body also includes either a matrix of conformable, stiff, voided material or upper and lower integral face plates bonded to the sides of the elements.

In one of these embodiments, a matrix of conformable, stiff, voided material extends the full depth of the composite body and is bonded to each of the elements over the full length of each of the element sides. The voided material includes a hard polymeric material and about 1–50 volume percent voids. In this embodiment, upper and lower surfaces of the integral face plate are coplanar with upper and lower ends, respectively, of the elements to provide the upper and lower faces, respectively, of the composite body. In an alternate embodiment, an upper integral face plate and a lower integral face plate are spaced apart from one another. Each of the integral face plates extends through only a portion of the depth of the composite body and is bonded to each of the elements over only a portion of each of the sides. The outer planar surfaces of the upper and lower integral face plates are coplanar with upper and lower ends, respectively, of the elements to provide the upper and lower faces, respectively, of the composite body.

In other embodiments, the invention is a method of fabricating a conformable composite acoustic transducer panel including a conformable composite body. The method involves placing in a mold a ceramic body having a base and an array of individual piezoelectric or electrostrictive ceramic elements. Each of the elements has opposing first and second ends and one or more sides interconnecting the first and second ends. The elements are disposed normal to the base with the first ends fixed thereto. A polymer is disposed over the ceramic body within the mold to a depth sufficient to encapsulate the base and the elements to form an encapsulated ceramic body. The encapsulated ceramic body is machined to remove the base and expose the first and second element ends, producing the conformable composite ceramic body.

In one of these embodiments, the encapsulating polymer is a conformable, stiff, voided material including a hard polymeric material and about 1–50 volume percent voids. The voided polymeric material is disposed to extend the full depth of the composite body to form a matrix encapsulating the base and the elements to form the encapsulated ceramic body. The polymer bonds to each element over the full length of the element sides. The encapsulated composite body is machined as described above to produce the conformable composite ceramic body. Outer surfaces of the matrix provide the first and second planar faces of the conformable composite body. In an alternate embodiment, a conformable composite acoustic transducer panel including a conformable composite body having first and second planar faces is fabricated. The method involves disposing a polymer over the ceramic body within the mold to a first depth encapsulating the base and a portion of the element sides adjacent the first element ends, leaving a portion of each of the element sides unencapsulated to form a partially encapsulated ceramic body. The polymer is selected to provide on curing a first stiff polymeric integral face plate bonded to the portion of the element sides adjacent to the first element ends. The partially encapsulated ceramic body is inverted in the mold such that the base and the first integral face plate are supported in the mold by the unencapsulated portion of the elements. The polymer is disposed over the inverted ceramic body within the mold to a second depth encapsulating a portion of each of the element sides adjacent the second element ends, leaving a portion of each of the element sides unencapsulated. On curing of the polymer an encapsulated ceramic body is formed having a first stiff polymeric integral face plate bonded to the portion of the element sides adjacent the first element ends, a second stiff polymeric integral face plate bonded to the portion of the element sides adjacent the second element ends, and a gap between the integral face plates. A stiff polymeric edge joining means may be applied to the encapsulated body to join the first and second integral face plates at their outer edges and enclose the gap. The encapsulated ceramic body is machined as described above, producing the conformable composite ceramic body. Outer surfaces of the first and second integral face plates provide the first and second planar faces of the conformable composite body.

BRIEF DESCRIPTION OF THE DRAWINGS

For a better understanding of the present invention, together with other objects, advantages, and capabilities thereof, reference is made to the following Description and appended Claims, together with the Drawing in which:

DETAILED DESCRIPTION OF THE PREFERRED EMBODIMENTS

Figure 1:
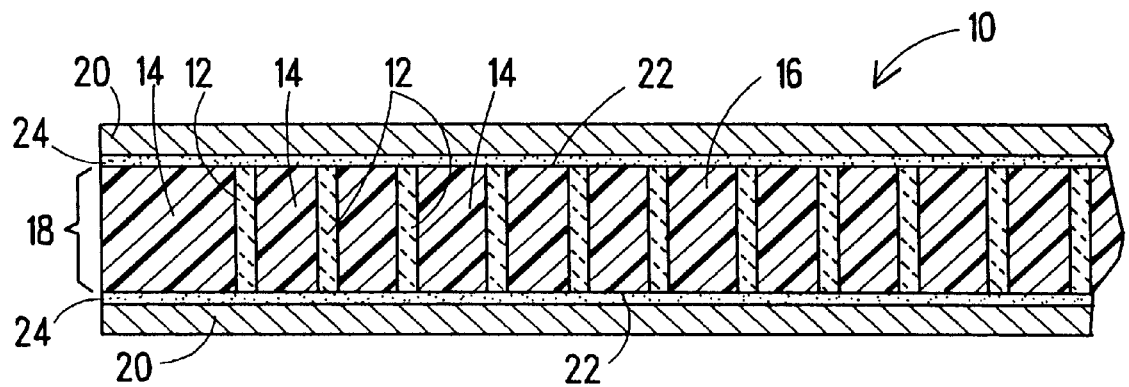
FIG. 1 is a cross-sectional elevation view of an acoustic transducer panel in accordance with the prior art.

The composite acoustic transducer panel described below is an improvement of the typical prior art transducer panel illustrated in FIG. 1. FIG. 1 shows a cross section of prior art composite transducer panel 10 in which rods or elements 12 of a piezoelectric or electrostrictive ceramic material, e.g., PZT are arranged in an array and are encapsulated in soft polymeric matrix 14, e.g., a soft polyurethane including voids 16, i.e., minute hollow polymeric spheres, to form composite body 18. A similar composite body and its fabrication are described in further detail in U.S. Pat. No. 5,340,510, referenced above. Stiff GRP face plates 20 are bonded to opposite face surfaces 22 of composite body 18 by layers 24 of a conductive adhesive, e.g., a conductive epoxy adhesive, to enhance uniform plane-front surface displacement at the surface of transducer panel 10. However, they also prevent transducer panel 10 from being bendable, conformable, or conformal to other surfaces, e.g., non-planar surfaces. Additionally, bonding of face plates 20 to composite body 18 with adhesive layers 24 may render the devices susceptible to shock damage. Clearly, for some applications such as large-area, underwater, and shock-prone applications, a more rugged and conformable design is required.

The composite transducer panels in accordance with the invention eliminate the need for separate, adhesively bonded face plates of the prior art panel illustrated in FIG. 1. Instead, the novel transducer panel includes integral polymer face plates or a voided conformable matrix, each described in further detail below. In the embodiments including the conformable matrix a specifically defined voided, stiff matrix phase completely encapsulates the PZT rods, while in the embodiments utilizing the integral face plates a stiff matrix material partially encapsulates the rods at the opposite faces of the composite panel but does not contacts the rod side surfaces at the center of the panel.

The descriptions below of various illustrative embodiments shown in the Drawings is not intended to limit the scope of the present invention, but merely to be illustrative and representative thereof.

Figure 2:
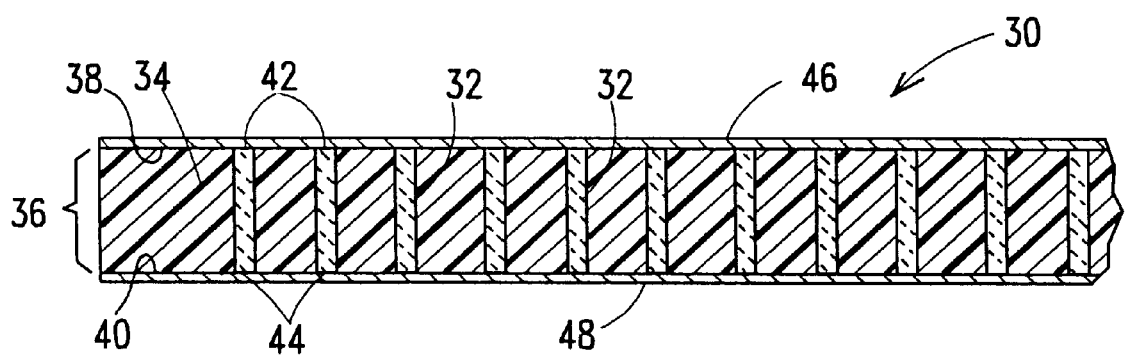
FIG. 2 is a cross-sectional elevation view of an acoustic transducer panel in accordance with one embodiment of the invention.
Figure 3:
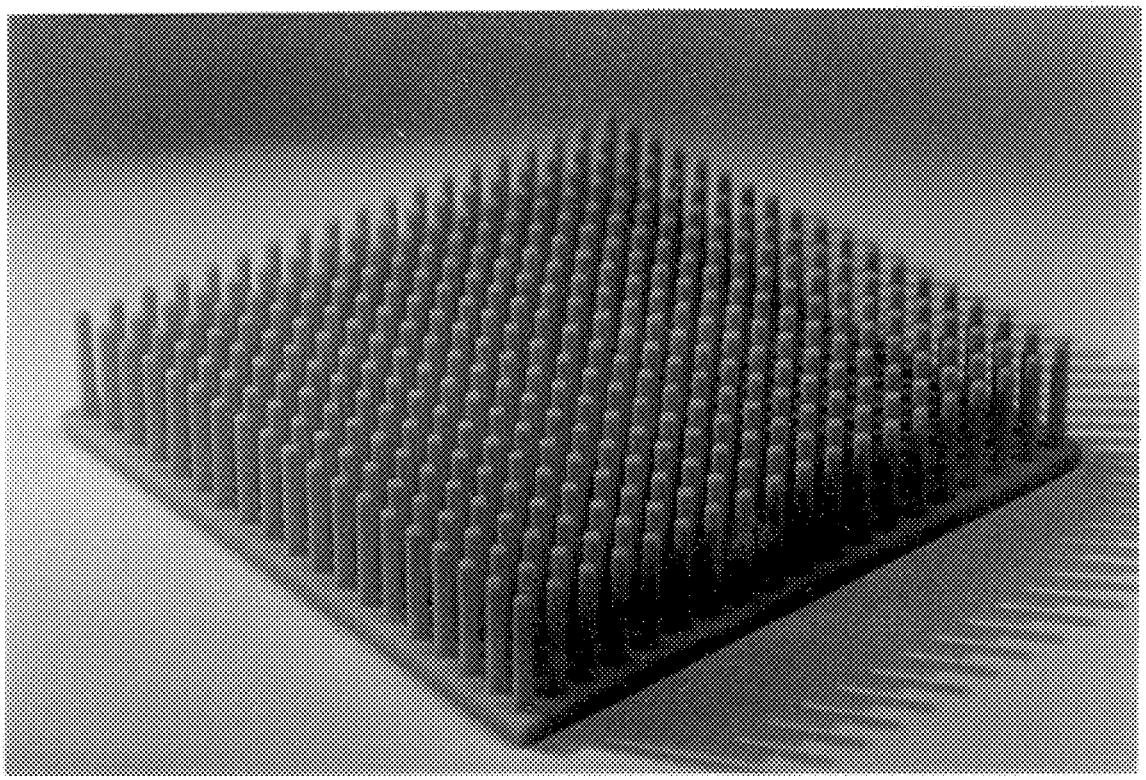
FIG. 3 is a perspective view of a ceramic preform useful for fabricating the acoustic transducer panels illustrated in FIGS. 2 and 9.

Turning now to FIG. 2, composite acoustic transducer panel 30 in accordance with one embodiment of the invention includes rods or elements 32 of a piezoelectric or electrostrictive ceramic material, e.g., PZT arranged in an array typical of prior art 1-3 composites. Rods 32 are encapsulated in conformable stiff polymeric matrix 34 to form composite body 36. Rods 32 may be provided by any known method for fabricating 1-3 composites, for example that described in U.S. Pat. No. 5,340,510, referenced above. Conformable stiff matrix 34 is fabricated from a hard polymeric material such as epoxy or hard polyurethane, preferably one having a hardness of at least 70 shore D. Voids (not shown) are homogeneously distributed throughout matrix 34 in an amount of about 1–50, preferably 5–25 volume %. The voids may be provided by, e.g., minute hollow polymeric spheres or other filler materials. The voided hard polymeric material is cast over a 1-3 preform in a mold. The 1-3 preform is shown in FIG. 3 and is described below and in U.S. Pat. No. 5,340,510. Upper face 38 and lower face 40 of composite body 36 may be ground to expose rod ends 42 and 44. Electrodes 46 and 48 are applied to upper and lower faces 38 and 40, respectively, to contact rod ends 42 and 44 to provide electrically activatable transducer panel 30. This device can be rendered conformable to non-planar mounting surfaces by the application of heat and pressure. The voids distributed throughout the stiff matrix lower the density of the matrix and reduce acoustic decoupling between the PZT ceramic elements. The device is stronger than prior art transducer panels, resisting delamination, because the matrix material bonds well to the sides of the ceramic rods. If desired, the electroded upper and lower surfaces may be protected, EMI shielded, and/or further strengthened by applying or casting a further layer of the voided stiff material used for the matrix or by bonding on stiff cover plates of, e.g., GRP or metal or flexible circuit board material.

FIG. 3 shows a photograph of a typical 1-3 densified preform, for example, one injection molded in accordance with the process described in U.S. Pat. No. 5,340,510, referenced above. This preform may be used to fabricate the transducer panel of FIG. 2 or any of the transducer panels described below. The preform includes a planar ceramic base with a plurality of ceramic rods or elements extending normal to the base in a regular array. A typical size for such a preform is about 50 mm×50 mm with rods or elements 0.2–2 mm in diameter and having an aspect ratio (length to diameter) of about 3:1 to about 20:1. Although injection molding is preferred for fabrication of the preform, other methods may be used, e.g., slip casting or dicing, as described in U.S. Pat. No. 5,340,510. The ceramic is a piezoelectric or electrostrictive material, e.g., a lead zirconate titanate (PZT), lead magnesium niobate (PMN), or similar materials, as described in U.S. Pat. No. 5,340,510. The preferred preform has been densified by known means, e.g., sintering, to a density of at least about 95%, preferably at least about 97%, of theoretical density. For the fabrication method described herein, a densified preform having a base interconnecting the rods is preferred. Several densified preforms may be arranged edge to edge in a planar encapsulation mold of a size selected to fabricate a panel of the desired size. The combined preforms then form an array of rods or elements larger than the size of each individual preform. The appropriate encapsulating material is then cast over the array of rods in the mold to form the composite body. Alternatively, a single preform may be placed in an appropriately sized encapsulation mold and the encapsulating material cast over the preform to form the composite body.

Figure 7:
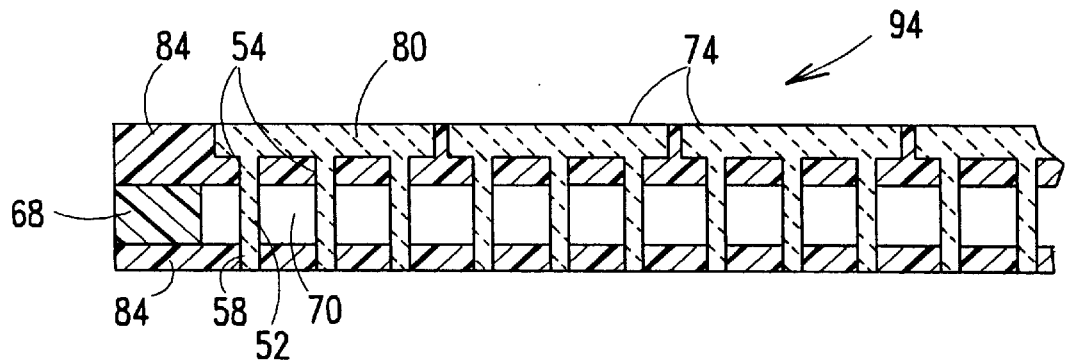
Figure 8:
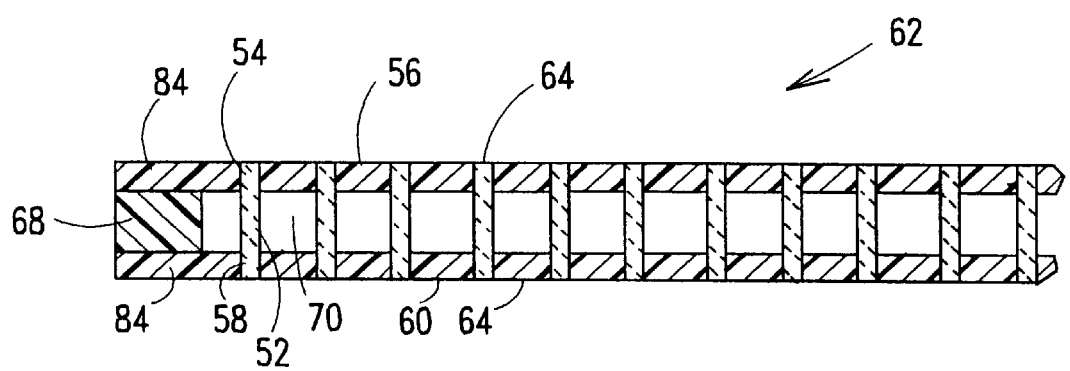
Figure 9:
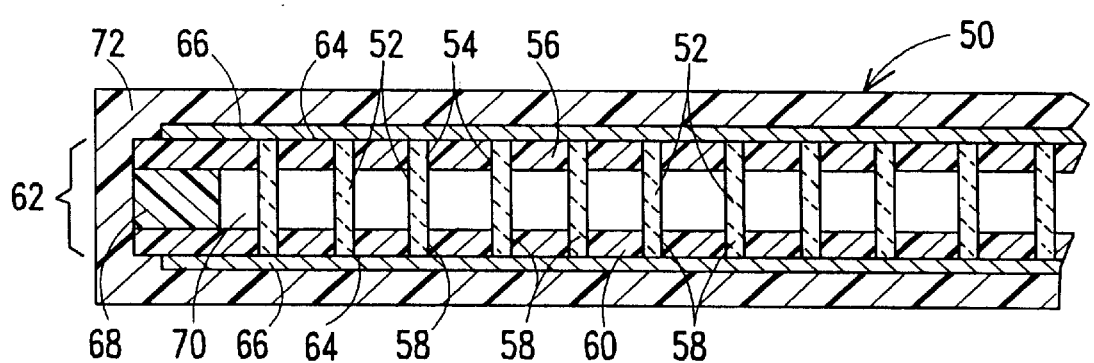

FIGS. 4–9 illustrate the fabrication of a composite acoustic transducer panel in accordance with another embodiment of the invention. FIG. 9 shows the completed conformable composite transducer panel 50 including rods or elements 52 of a piezoelectric or electrostrictive ceramic material, e.g., PZT arranged in an array typical of prior art 1-3 composites, e.g., that array shown in FIG. 3. Rods 52 are partially encapsulated at their upper ends 54 in stiff polymeric upper integral face plate 56 and at their lower ends 58 in stiff polymeric lower integral face plate 60 to form composite body 62. As used herein, the term "face plate" is intended to mean a stiff plate at one face of the composite body which serves to provide more uniform plane-front surface displacement at the surface of the body. However, the "integral" face plates described herein are stiff plates which are molded or otherwise fabricated to be a part of (integral with) a composite body, not merely end caps or cover plates bonded to the ends of the ceramic elements with adhesive layers as in the prior art face plates. In this embodiment, each integral face plate provides a stiff partial matrix surrounding rod ends 54 or 58. Typical materials for integral face plates 56 and 60 include, e.g., hard polyurethanes, epoxy resins, and thermoplastic resins. Upper and lower faces 64 of composite body 62 are ground to expose rod ends 54 and 58. Thin upper and lower electrodes 66, e.g., of vapor deposited or screen printed metal, applied at upper and lower faces 64 electrically contact rod ends 54 and 58 to provide electrically activatable transducer panel 50.

Hard polymeric edge strips at all four edges of composite body 62 (only edge strip 68 is shown for clarity) provide stability to the body and cooperate with integral face plates 56 and 60 to enclose air gap 70 within composite body 62. Preferably, the polymer of edge strip 68 is the same as that of integral face plates 56 and 60. Optionally, transducer panel 50 may be rendered waterproof before use by encapsulation, e.g., in polyurethane jacket 72.

Figure 4:
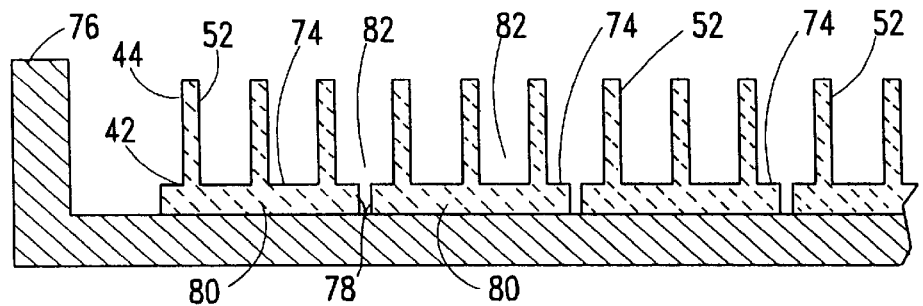
FIGS. 4–9 are cross-sectional elevation views illustrating steps in the fabrication of an acoustic transducer panel in accordance with another embodiment of the invention, the completed transducer panel being shown in FIG. 9.

Typical steps in the fabrication of this transducer panel are illustrated in FIGS. 4–9. FIG. 4 shows several densified preforms 74, e.g., several of the preforms shown in FIG. 3, arranged edge to edge in planar encapsulation mold 76 of a size selected to fabricate a panel of the desired size. (In FIGS. 4–7, the preforms are shown in simplified form for clarity of illustration.) The combined preforms then form an array of rods or elements 52 larger than the size of each individual preform 74. Alternatively, the subsequent steps of the method may be carried out on a single preform 74 in an appropriately sized encapsulation mold.

Figure 5:
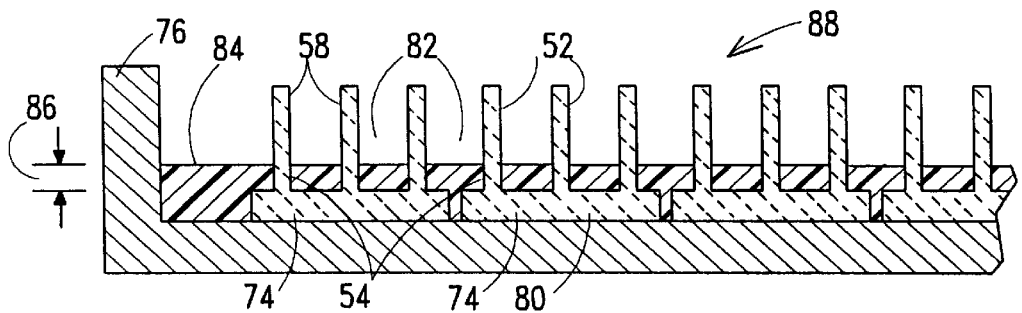

The coplanar array of preforms 74 is then partially encapsulated in encapsulation mold 76, as shown in FIG. 5. Polymeric encapsulant 84 is cast in mold 76, e.g., as a melt or liquid, flowing into troughs 82 to depth 86 above bases 80 to partially encapsulate rods 52 at ends 54 adjacent bases 80, leaving opposite rod ends 58 free, and forming partial composite structure 88. A typical depth 86 is, e.g., 1–2 mm. Encapsulant 84 is selected to be castable but to be rigid after curing. Typical encapsulants 84 are hard polyurethanes and epoxy resins. Optionally, for some applications, encapsulant 84 may include voids, particles, or other fillers (not shown). For example, minute hollow polymeric spheres may be dispersed throughout encapsulant 84 to decrease the weight of the transducer. Alternatively, encapsulant 84 may be made electrically conductive, e.g., by the addition of a conducting material such as metal particles or carbon, so as to function as an electrode. In another alternative, a dense particulate additive material, e.g., steel, lead, tungsten, etc., may be incorporated into encapsulant 84 to increase the mass of the integral face plate, for the purpose of reducing the transducer resonant frequency.

Figure 6:
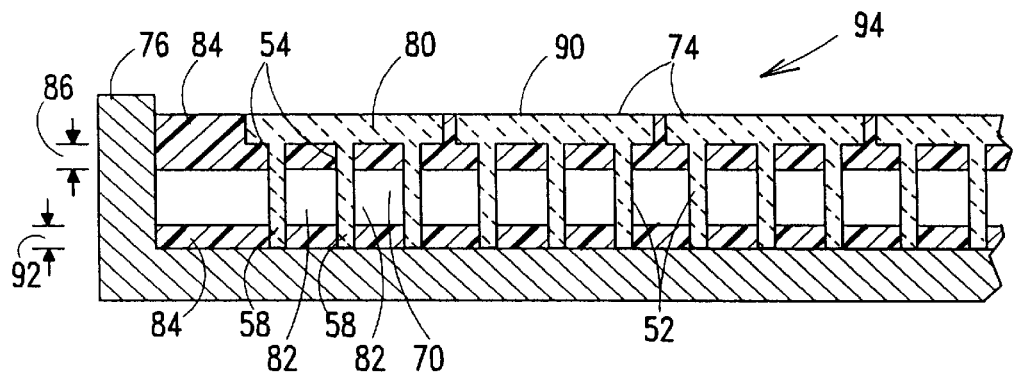

After curing of encapsulant 84, partial composite structure 88 is inverted in mold 76, as shown in FIG. 6, with free rod ends 58 resting on the mold and bases 80 forming a top surface 90. An additional amount of encapsulant 84 is cast in mold 76 to fill the open ends of troughs 82 to depth 92, partially encapsulating rods 52 at ends 58. Preferably, depth 92 is approximately equal to depth 86. Both depth 86 and depth 92, however, are selected to leave air gap 70 between layers of encapsulant 84.

After curing of the additional encapsulant 84, composite body blank 94 is removed from mold 76, as shown in FIG. 7, and hard polymeric edge strips 68 are cast in a separate operation. only one edge strip 68 is shown in the Figure, but all edges of blank 94 are filled with edge strips 68 to enclose air gap 70. In most embodiments, it is preferred that the polymer of edge strip 68 is the same as that of encapsulant 84. An exception to this preference is an embodiment in which encapsulant 84 is a conducting material, in which case an electrically insulating material is selected for edge strip 68 to avoid shorting of the electrodes.

Composite body blank 94 is then machined to remove bases 80 and to expose ends 54 and 58 of rods 52 at planar faces 64 to form composite body 62, shown in FIG. 8. Thus cured, machined encapsulant 84 forms integral face plates 56 and 60 at rod ends 54 and 58, respectively. Composite body 62 includes rods 52, integral face plate 56 fixing the rods in their array at rod ends 54, integral face plate 60 fixing the rods at rod ends 58, edge strips 68 around all edges of composite body 62, and enclosed air gap 70. Rod ends 54 and 58 are exposed at upper and lower faces 64 and air gap 70 is completely enclosed by face plates 56 and 60, rods 52, and edge strips 68.

To complete transducer panel 50, electrodes 66, for example screen printed silver epoxy or vapor deposited gold electrodes, are applied to faces 64, as shown in FIG. 9. Optionally, after wiring by conventional means (not shown), the entire transducer panel 50 is then encapsulated in jacket 72. (Optionally, a jacket similar to jacket 72 may be provided to encapsulate transducer panel 30 of FIG. 2.)

Figure 10:
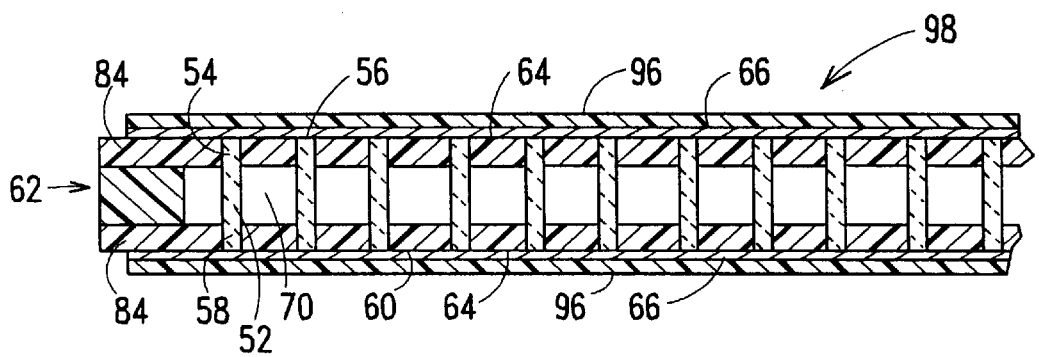
FIG. 10 is a cross-sectional elevation view of an acoustic transducer panel in accordance with yet another embodiment of the invention.

Yet another embodiment is illustrated in FIG. 10. In FIG. 10, like features to those shown in FIGS. 4–9 are indicated by the same reference numerals. Conformable composite body 62 with electrodes 66 deposited thereon is further improved by flexible circuit boards 96 applied on either side of the electroded composite body and bonded to electrodes 66. Any conventional circuit board material may be used. Optionally, the circuit board conductor can be patterned by conventional means to allow selected areas of the composite to be connected electrically as individual elements of an array. The circuit board layers provide a strong and rugged device without significant reduction in its conformability because of the flexible nature of the circuit board material. Flexible circuit boards 96 can also be adapted in known manner to provide EMI shielding for the device. A preferred material for flexible circuit boards 96 is a polyimide material plated on both sides with copper conductors.

In an alternate embodiment, separate areas of the transducer panel provide regions, each including one or more elements, and separate upper and lower electrodes are provided for each region to electrically contact the elements within that region. The above-described flexible circuit boards may then be adapted to provide separate electrical contacts to each of these separate electrodes so that the elements in each region may be activated independently of the elements in other regions.

Figure 11:
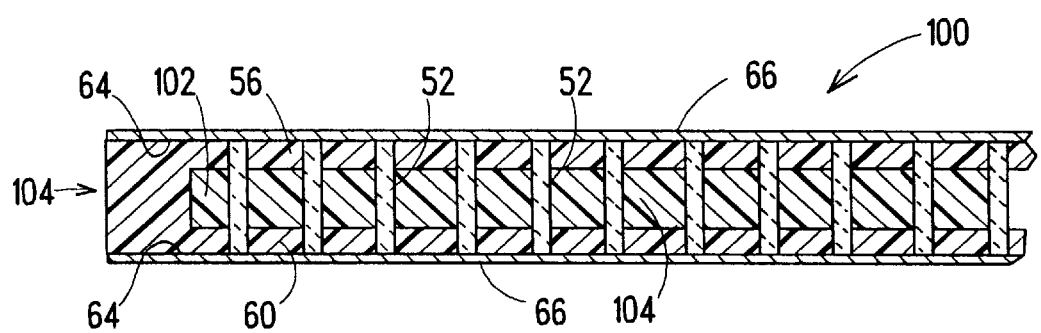
FIG. 11 is a cross-sectional elevation view of an acoustic transducer panel in accordance with still another embodiment of the invention.

Still another embodiment is illustrated in FIG. 11. In FIG. 11, like features to those shown in FIGS. 4–9 are indicated by the same reference numerals. Conformable composite transducer panel 100 includes PZT rods 52 arranged in a 1-3 array and partially encapsulated at their upper and lower ends 54 and 58 in hard polymeric upper and lower integral face plates 56 and 60, as described above. Hard polymeric edge strips 68 enclose the gaps between integral face plates 56 and 60, also as described above.

However, rather than air gaps 70 as shown in FIGS. 9 and 10, the space enclosed by rods 52, integral face plates 56 and 60, and edge strips 68 is filled with soft polymeric layer 102 to form composite body 104. In one embodiment of the method described herein, soft polymeric layer 102 may be cast from a soft polymeric material after the casting of upper integral face plate 56 (FIG. 5). After curing of soft polymeric layer 102, partial composite body 88 need not be inverted in the mold for casting of lower integral face plate 60 (FIG. 9), since no space is required between the integral face plates and the soft polymeric layer. Lower integral face plate 60 may be cast directly over soft polymeric layer 102. Typically, soft polymeric layer 102 is compressible and/or includes voids (not shown), e.g., minute hollow polymeric spheres. The preferred material for layer 102 is a voided soft polyurethane or rubber, although other suitable soft polymeric materials may be selected empirically with minimal experimentation. Thin upper and lower electrodes 66 are applied at upper and lower faces 64 to electrically contact the ends of rods 52, as described above, to provide electrically activatable transducer panel 100. Optionally, transducer panel 100 may be encapsulated in a jacket similar to jacket 72, also described above. Also optionally, soft polymeric layer 102 may extend out to the edges of face plates 56 and 60, and edge strips 68 may be omitted.

In other embodiments of the method described herein, soft polymeric layer 102 (as described above and shown in FIG. 11) is cast before the casting of encapsulant 84 which forms upper and lower integral face plates 56 and 60. In one embodiment, a soft polymeric material is molded to cover one end of each of rods 52, leaving the opposite ends unencapsulated. The soft polymer typically is the same type of soft polymer used to form the above-described soft polymeric layer shown in FIG. 11. For example, the soft polymer may be compressible and/or may include voids, e.g., minute hollow polymeric spheres. The preferred soft polymeric material is a voided soft polyurethane or rubber, although other suitable soft polymeric materials may be selected empirically with minimal experimentation. The soft polymer is cured and the ceramic base is removed. Then, the cured soft polymer is partially removed by, e.g., abrading or dissolving away the excess material to, e.g., depth 92 (FIG. 6) to form a layer similar to soft polymeric layer 102. The rod ends are exposed at both upper and lower body faces 64 so that they extend outward from or "stand proud" above and below opposite surfaces of the soft polymeric layer. In an alternate method, a layer of a sacrificial material, e.g., a dissolvable or meltable wax is cast to form a layer encapsulating one end of the rods, e.g., to depth 86 (FIG. 5) leaving the opposite end of the rods unencapsulated. The soft polymeric layer is then cast leaving the rod ends exposed, e.g., to depth 92. Removal of the ceramic base and the sacrificial layer leaves the rods exposed at both ends. In either of these embodiments, encapsulant 84 is then cast to form the upper and lower integral face plates encapsulating the ends of rods 52 and forming composite body 104. If desired, edge strips may also be cast from encapsulant 84, as described above. The transducer panel is then completed as described above with reference to FIG. 11.

The piezoelectric or electrostrictive ceramic elements described with regard to FIGS. 2–11 are cylindrical rods. Alternatively, the elements may be rectangular, hexagonal, or any shape conventional for the above-described 1-3 composites. Also alternatively, the composite may be a 2-2 composite having thin, rectangular elements embedded in a conformable stiff polymeric matrix or in stiff polymeric integral face plates, with or without air gaps, in a manner similar to that described above for the 1-3 composites. As an alternative to PZT, the rods or elements may be fabricated from another piezoelectric or electrostrictive ceramic material, for example, a lead zirconate titanate (PZT), lead magnesium niobate (PMN), barium titanate (BT), lead titanate (LT), or similar materials, as described in U.S. Pat. No. 5,340,510. In an alternative fabrication method, the elements may be pressed into the material of the integral face plate while it is in a softened state.

The invention described herein presents to the art novel, improved composite transducer panels which are stronger and more rugged than prior art composite transducer panels. The panels can be conformed to the mounting platform and exhibit high response levels in hydrostatic sensing and actuation applications.

While there has been shown and described what are at present considered the preferred embodiments of the invention, it will be apparent to those skilled in the art that modifications and changes can be made therein without departing from the scope of the present invention as defined by the appended Claims.

We claim:

1. A method of fabricating a conformable composite acoustic transducer panel comprising a conformable composite body having first and second planar faces, said method comprising the steps of:

placing in a mold a ceramic body having a base and an array of individual piezoelectric or electrostrictive ceramic elements, each of said elements having opposing first and second ends and one or more sides interconnecting said first and second ends, said elements being disposed normal to said base with said first ends fixed thereto;

disposing a polymer over said ceramic body within said mold to a first depth encapsulating said base and a portion of each of said element sides adjacent said first element ends, leaving a portion of each of said element sides unencapsulated to form a partially encapsulated ceramic body, said polymer being selected to provide on curing a first stiff polymeric integral face plate bonded to said portion of said element sides adjacent said first element ends;

inverting said partially encapsulated ceramic body in said mold such that said base and said first integral face plate are supported in said mold by said unencapsulated portion of said elements;

disposing said polymer over said inverted ceramic body within said mold to a second depth encapsulating a portion of each of said element sides adjacent said second element ends, leaving a portion of each of said element sides unencapsulated to form on curing of said polymer an encapsulated ceramic body having a first stiff polymeric integral face plate bonded to said portion of said element sides adjacent said first element ends, a second stiff polymeric integral face plate bonded to said portion of said element sides adjacent said second element ends, and a gap between said integral face plates;

machining said encapsulated ceramic body to remove said base and expose said first and second element ends, producing said conformable composite ceramic body, outer surfaces of said first and second integral face plates providing said first and second planar faces of said conformable composite body.

2. A method in accordance with claim 1 further comprising the step of applying a stiff polymeric edge joining means to said encapsulated body to join said first and second integral face plates at their outer edges and enclose said gap.

3. A method in accordance with claim 1 further comprising the step of applying first and second thin, flexible electrodes to said first and second planar faces, respectively, of said conformable composite body to bond said first and second electrodes thereto to form said transducer panel.

4. A method in accordance with claim 3 further comprising the step of:

bonding a flexible circuit board to each of said electrodes, each of said circuit boards providing electrical contact to its respective one of said electrodes and EMI shielding to said transducer panel.

5. A method in accordance with claim 1 further comprising the steps of:

bonding upper and lower thin, flexible electrodes to portions of said first and second planar faces in each of at least two regions of said panel, each of said regions including one or more of said elements, to electrically contact only those of said elements within that region;

bonding a flexible upper circuit board to said upper electrode, said upper circuit board providing a separate electrical contact to each of said upper electrodes; and bonding a flexible lower circuit board to said lower electrode, said lower circuit board providing a separate electrical contact to each of said separate lower electrodes, such that those of said elements in each region may be activated independently of those of said elements in other regions.

* * * * *